United States Patent [19]
Ingraham et al.

[11] Patent Number: 5,926,369
[45] Date of Patent: Jul. 20, 1999

[54] VERTICALLY INTEGRATED MULTI-CHIP CIRCUIT PACKAGE WITH HEAT-SINK SUPPORT

[75] Inventors: Anthony P. Ingraham; Glenn L. Kehley, both of Endicott; Sanjeev B. Sathe, Johnson City; John R. Slack, Vestal, all of N.Y.

[73] Assignee: International Business Machines Corporation, Armonk, N.Y.

[21] Appl. No.: 09/009,862

[22] Filed: Jan. 22, 1998

[51] Int. Cl.⁶ .................................................. H05K 7/20

[52] U.S. Cl. .................... 361/699; 361/695; 361/704; 361/749; 361/752; 165/80.3; 165/185; 174/16.3; 174/52.4

[58] Field of Search .................................. 361/683, 689, 361/704–727, 749, 738, 752, 313; 165/80.2, 80.3, 80.4, 185, 905; 174/163, 52.4, 35 MS, 254; 257/676, 668, 727, 706, 688, 698, 724, 723; 439/73, 69; 428/209, 36.3; 29/840, 830, 831

[56] References Cited

U.S. PATENT DOCUMENTS

| | | |
|---|---|---|
| 5,179,501 | 1/1993 | Ocken et al. . |
| 5,252,857 | 10/1993 | Kane et al. . |
| 5,345,205 | 9/1994 | Kornrumpf . |
| 5,382,829 | 1/1995 | Inoue . |
| 5,448,511 | 9/1995 | Paurus et al. . |
| 5,519,578 | 5/1996 | Fujii . |
| 5,544,015 | 8/1996 | Akami . |

*Primary Examiner*—Leo P. Picard
*Assistant Examiner*—Michael Datskovsky
*Attorney, Agent, or Firm*—Whitham, Curtis & Whitham; Arthur Samodovitz

[57] ABSTRACT

A multi-chip carrier which uses less lateral mounting space on the surface of a circuit board or card can be formed using flexible circuitized material. Lateral space is compressed by utilizing more vertical space to package chips and components. The problem of cooling multiple chips in a tight space may be accomplished by integrating the heat sink in with the circuit carrier and having the heat sink double as a support structure. A flex material is folded or shaped. Different regions of the flex are used for mounting chips, mounting support mechanisms, or mounting the structure on a carrier or substrate.

31 Claims, 9 Drawing Sheets

VERTICALLY INTEGRATED MULTI-CHIP CIRCUIT PACKAGE WITH HEAT-SINK SUPPORT

BACKGROUND OF THE INVENTION

1. Field of the Invention

The present invention generally relates to multi-chip circuit packaging and, more particularly, to cooling of multilevel chip carriers.

2. Background Description

Multi-chip packages have been used before with cooling provided by heat sinks. However, these packages do not efficiently use vertical space. The conventional manner of packaging is to attach a chip to a planar substrate and in turn affix a heat sink on top of the chip. Heat would then be conducted away from the heat sink. This uses valuable card "real estate" in the lateral (X-Y) and vertical space (Z) dimensions. Heat sinks, in the past, have been treated as separate entities with separate function, that being conducting heat away from the component.

SUMMARY OF THE INVENTION

It is therefore an object of the present invention to provide a multi-chip package which reduces the amount of horizontal space used and uses vertical space efficiently.

It is another object to provide a multi-chip package with an integrated heat sink.

Other functions of this invention include providing a support structure for a three dimensional electronic module packaging unit. The heat sink is integrated within the module rather than the conventional means which is attached onto or above the module. A module being usually comprised of a chip mounted on a substrate with some kind of connection to circuit board or card.

This invention solves the problem of reducing the lateral mounting space for a multi-chip module on the surface of a circuit board or card. Lateral space is compressed by utilizing more vertical space to package chips and components. The problem of cooling multiple chips in a tight space may be accomplished by integrating the heat sink with the circuit carrier and having the heat sink double as a support structure. The heat sink structures described herein are in the form of an internal support for the flexible circuitized carrier or an external support. Engineering changes or repairs to this modular package can be made easier by using solderless technology such as dendritic pads or conductive adhesive, for example. Dendritic pads are a solderless attachment in which spikes maintain contact with chip contacts as long as a load is exerted on the contact. When the load is removed the chips are removed easily.

The inventive carrier is comprised of a flexible material which is folded or shaped on a heat sink either contained within the flexible material or surrounding the flexible material. Different regions of the flexible material are used for mounting chips, mounting support mechanisms, or for mounting the structure on a carrier or substrate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
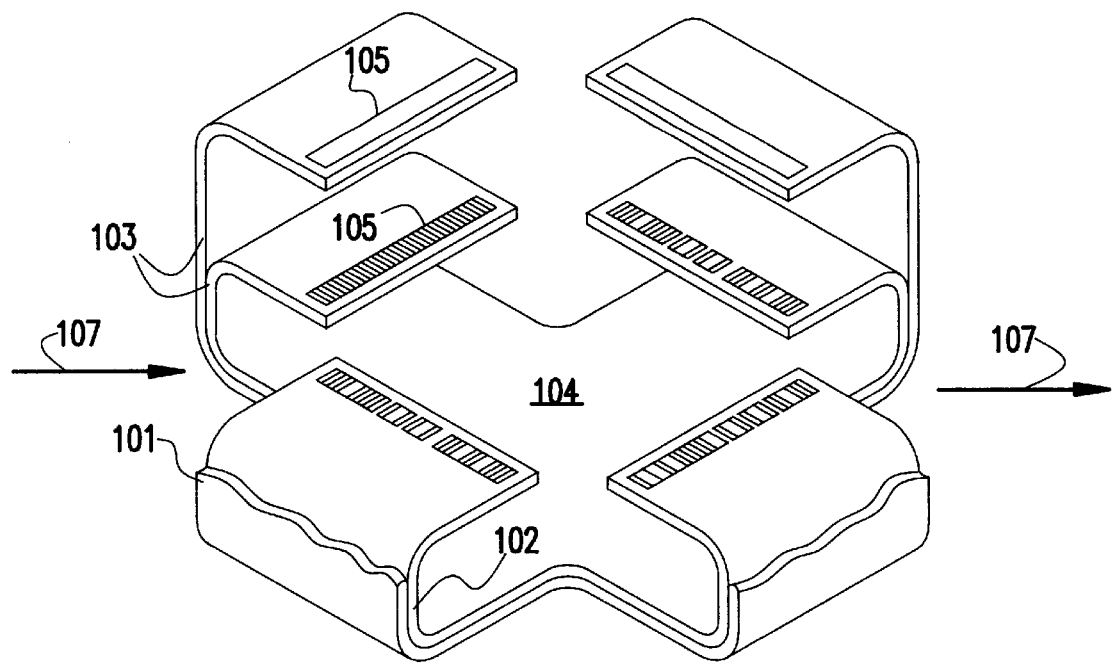
FIG. 1 is an isometric view of the folded flexible material of the inventive chip carrier.

Referring now to the drawings, and more particularly to FIG. 1, there is shown a folded flexible member used to create the inventive chip carrier. As shown, two layers of circuitized flexible material 101, 102 have been folded into a three dimensional (3D) form to create this carrier. As used herein, circuitized means including wiring patterns or traces thereon or therein for conducting clocks, signals, data, power ground, etc. Both layers 101, 102 start as a flat "cross (+)" shape. Leads 103 are bent twice at 90° angles towards the center 104. The longer leads 103 of the outer flexible material 101 create the upper level of the carrier. Each layer 101, 102 of the flexible material is circuitized.

Additional layers of component mounting may be introduced with the addition of more circuitized flexible material. While the respective leads are shown to be all of equal length and folded at 90°, it is to be understood that they can be folded at any desired angle, and be of varying heights, widths, and lengths which create more complex structures, and thus present opportunities to utilize more available vertical space as required in the machine.

The ends of each lead 103 contain pads 105 for mounting chips. The circuitized carriers have contact pads at the ends of the leads to allow Controlled, Collapse, Chip Connection (C4) mounting (i.e., solder ball connect) of chips and other components. The circuitized carriers make electrical connection typically in the center of the respective carrier by permanent plated thru vias, compression metallurgical bonding, or solder reflow. Bonds can also be removable by using palladium dendrite to gold pad, mechanical interconnection. Permanent connections can be made by using conventional solder reflow attachment. Similarly, the components which are mounted at the ends of the leads can be connected to dendrite plated pads.

As can be seen in the structure in FIG. 1, the folds of the leads 103 of the flexible material allow for air flow 107 through the chip carrier. Air flow 107 is directed through the openings between the leads 103 created when the circuit carrier are formed into a three dimensional structure.

While the example here shows the flexible material shape as a "cross (+)", it is to be understood that the design is not restricted to such a shape but can be any suitable regular or irregular shape that the packaging situation will allow. Air flow is not necessarily restricted to flow between the spaces of the formed leads of the aforementioned structure. Openings can also be made within the leads, to allow additional air flow, through said leads.

Figure 1A:
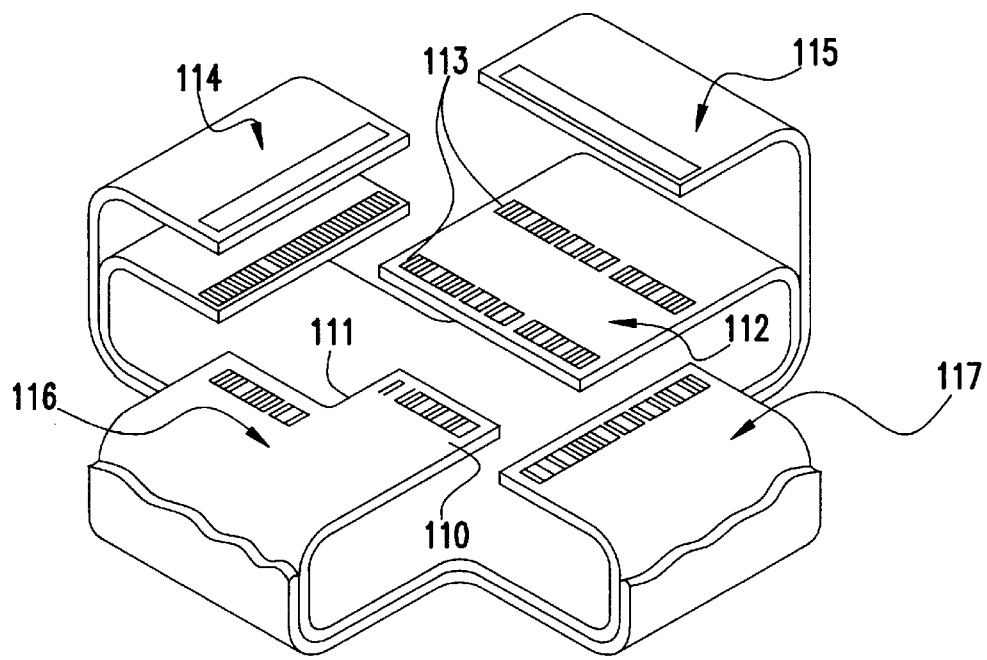
FIG. 1A is an isometric view of the folded flexible material of FIG. 1 where the legs are of varying height, width, and length forming and asymmetric package (module) configuration.

FIG. 1A shows an example of the folded flexible material folded in an asymmetrical configuration. Lead 114 is shown at a lower level than lead 115. Lead 112 is shown protruding more towards the center of structure, longer than lead 117. Lead 112 also has two rows of contact pads 113; one set at the end of the lead, and the other towards the center of the lead. Lead 116 has a split 111 and is shown with one section 110 towards the center of the package.

Figure 2:
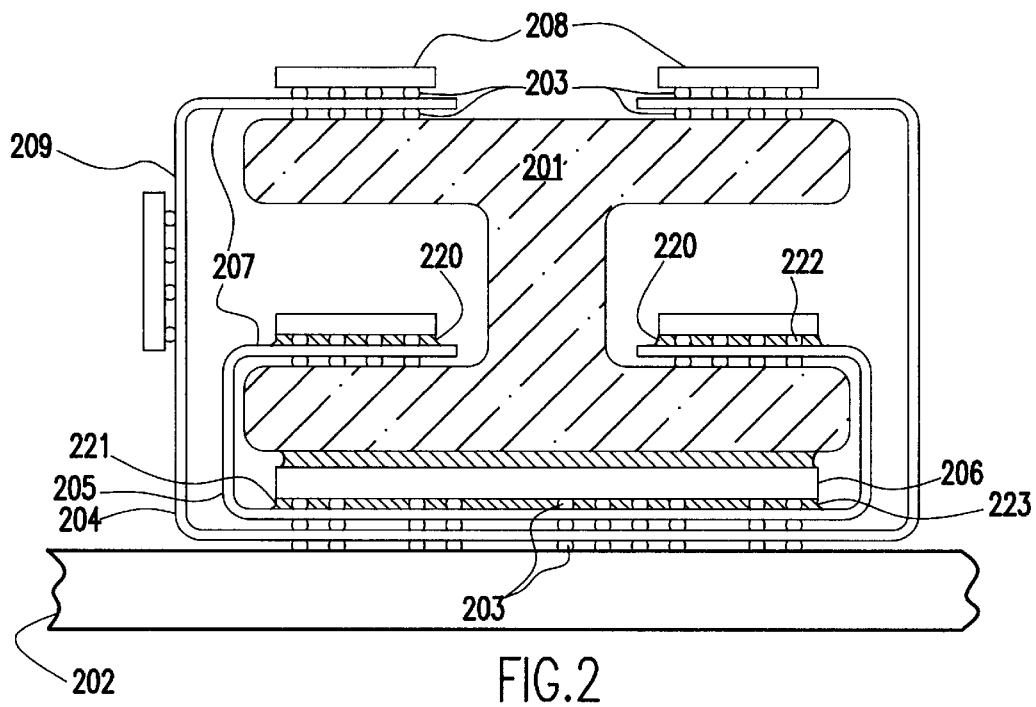
FIG. 2 is a cross-sectional view of the inventive chip carrier using a heat sink as a support member.

FIG. 2 shows the inventive chip carrier with an integrated heat sink 201 as an internal support structure. Interconnections 203 can be of various means such as solder ball connect, conductive adhesive, phase transition pressure bonding, or metal dendrite to pad. Metal dendrite to pad allows for a dismountable connection. Interconnections 203 are used to provide connection between the substrate 202 and circuitized flexible material 204, circuitized flexible material 204 and circuitized flexible material 205, between circuitized flexible materials 204 or 205 and chips, as well as between circuitized flexible material 204 and heat sink 201. As required, an underfill material 220 and 221 may be injected between solder ball connections 222 and 223.

A large chip 206 sits in the center of the flex 203 at the base of the folds of leads 207. The heat sink 201 is mounted on the large chip 206 with thermal adhesive. Thermal grease may be added to provide a more intimate contact and improve conductivity between the heat sink and large chip 206. If a non-permanent mounting of the heat sink is desired, thermal grease alone may be used. The heat sink 201 is shaped such that the leads 207 of flexible circuitized carrier 205 may be connected to a lower level of the heat sink and leads 207 of flexible circuitized carrier 204 may be mounted to an upper level of the heat sink 201. Small chips 208 are connected to the flexible circuitized carrier at the end of each lead 207. Additional mounting sites 209 may be vertically placed on leads 207 of the flexible circuitized carrier (support backing is not shown to simplify the description of positioning the chip).

Figure 2A:
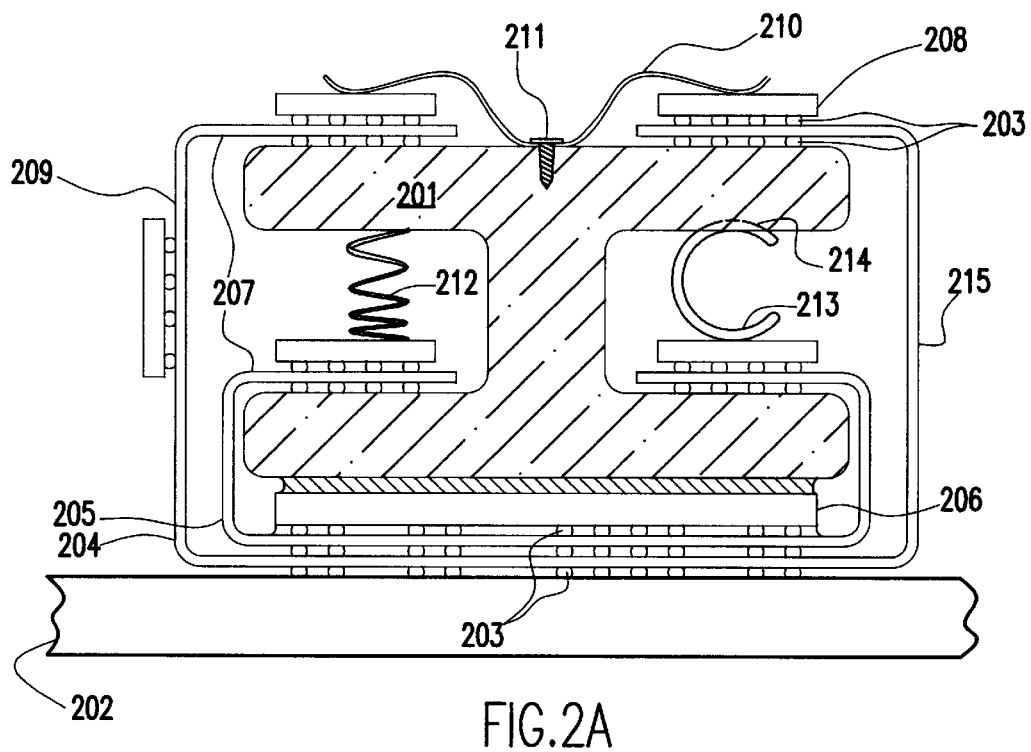
FIG. 2A is a cross-sectional view of the structure shown in FIG. 2 using springs, clips, and screws to provide contact between carrier and chips.

FIG. 2A shows a structure using dendrite to pad interconnection. Spring clip 213 produces an opposing mechanical force to provide a pressure to ensure dendrite to pad connection is maintained over thermal cycles and time. The clip 213 is retained by recess 214 in heat sink body 201. Another variation shows spring 212 providing a slight pressure on the chip to ensure the dendrite to pad connection is made. Yet another variation is shown with spring clip 210 held into position by screw 211 which is tapped into the heat sink body 201. The chips 208 are held in by compression to make the dendrite connections 203 between the chip 208, flexible carrier 215, and ground connection to heat sink 201. If required, the springs and clips can be coated with electrically insulated material or a force distribution plate can be inserted between the clip or spring and the top of the chip.

Figure 2B:
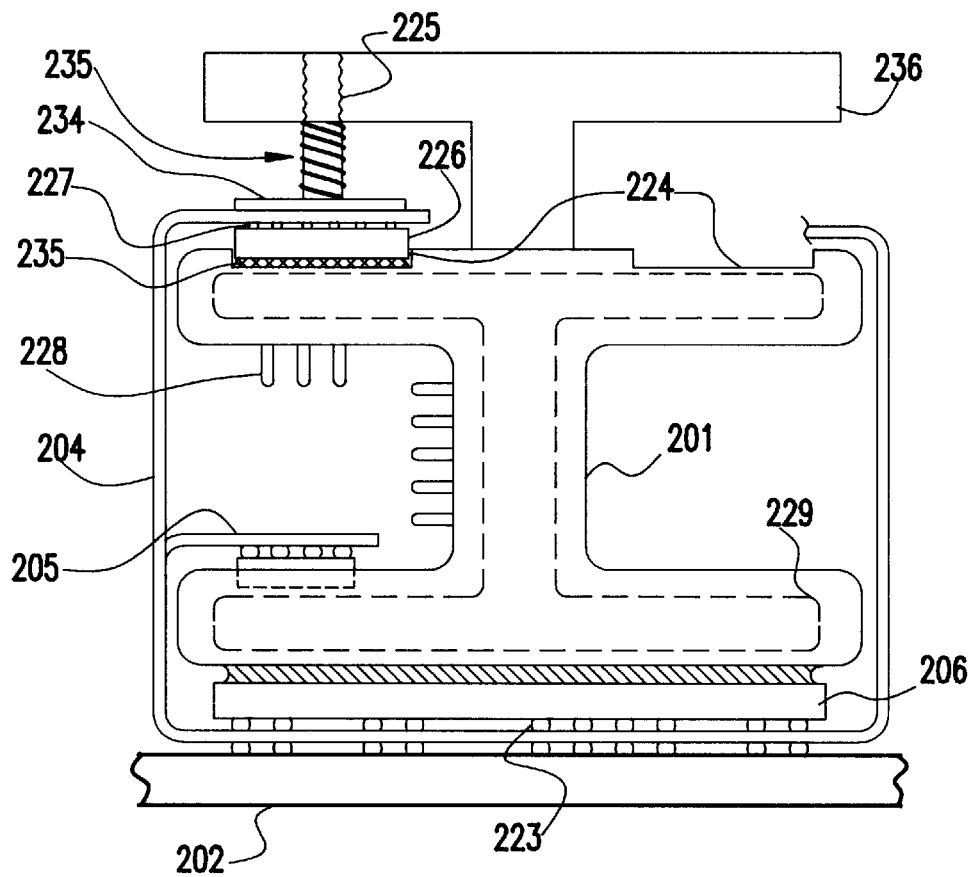
FIG. 2B is a cross-sectional view of the structure shown in FIG. 2 using a clamping mechanism and screws.

FIG. 2B shows more features which can be built into the overall package to enhance cooling. Member 236 can be added to the heat sink forming a third tier. It can be part of the body of the heat sink 201 or an extension which is screwed or mounted to the body. This member 236 may have a clamping mechanism 225, a spring and a head surface 234 which provides a retaining force to the flexible circuit 204, making contact to chip 226, through contacts 227. In this example, cavities 224 are shown one of which cradles the chip 226. Thermal grease, or electrical insulating adhesive 235 can be used between the chip top surface and the cavity 224. The thermal dissipation capability of the heat sink 201 can be enhanced by adding heat fins 228 or cooling channels for fluids 229. Fluid in this case is understood to be a gas or liquid. Various configurations of cooling channels can be used.

Figure 2D:
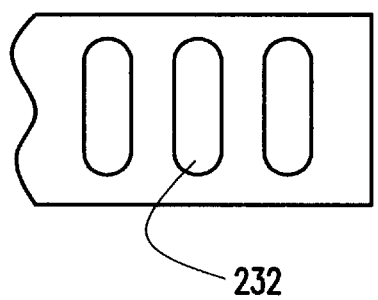
FIGS. 2C and 2D are plan views showing configurations of cooling channels which may be used in the structure of FIG. 2.
Figure 2C:
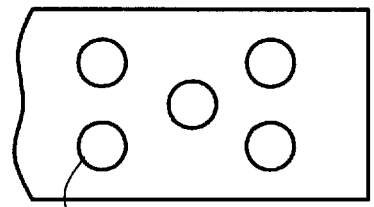

Some examples of cooling channels 229 are shown in FIGS. 2C and 2D. FIG. 2C shows channels of cylindrical geometry 231 and FIG. 2D shows channels of an elongated shape 232. These channels 231 or 232 can be part of a heat pipe and have any cross sectional shape. A heat pipe includes a section of channels 229 (that may have shape 231 or 232) where a liquid is vaporized and the vapor travels to a condenser external to the heat sink where the vapor recondenses into a liquid while radiating heat. Alternatively, the channels 229 can be formed through the heat sink 201 to allow additional air flow through the body.

Figure 2E:
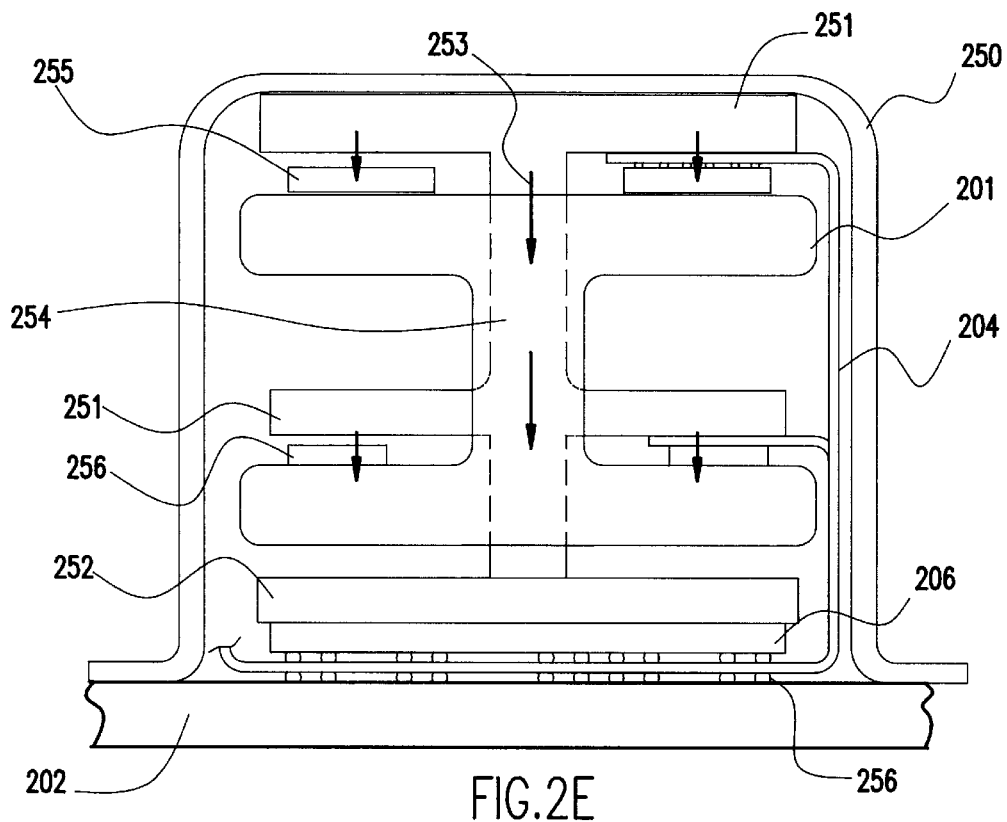
FIG. 2E is a cross-sectional view of the structure shown in FIG. 2 including a chip carrier with an integrated slide system.
Figure 2F:
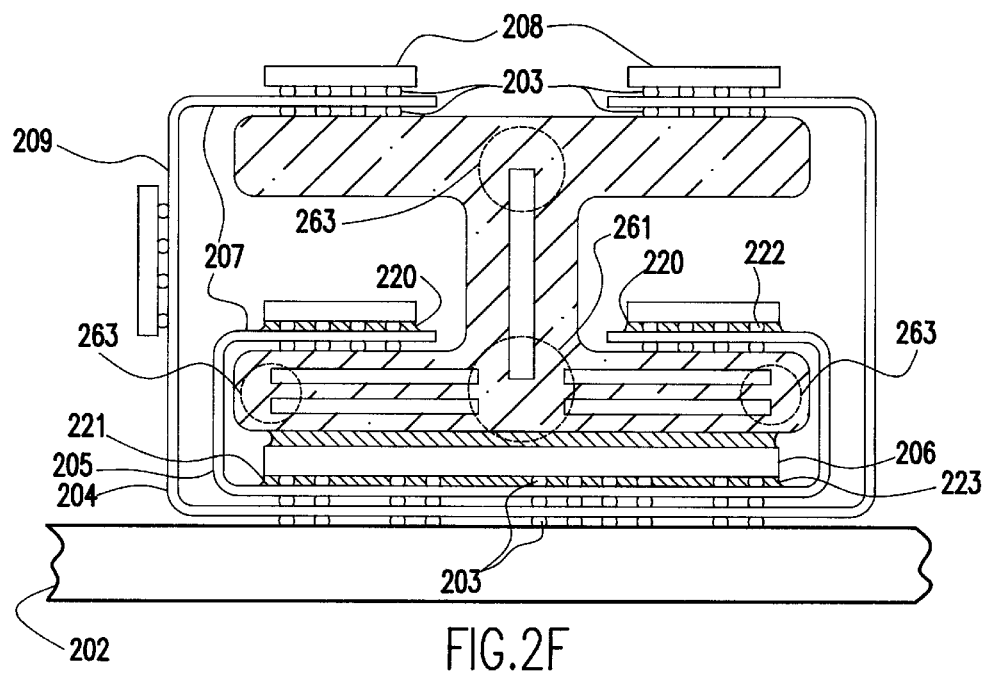
FIG. 2F is a cross sectional view of the structure shown in FIG. 2 having a heat pipe within an integrated heat sink.

FIG. 2F shows the inventive carrier with an integrated heat sink 201 having a heat pipe. The heat pipe has evaporation 261 and condensor 263 sections. Heat sink 201 is in contact with a chip 206 which may produce heat for the evaporation section 261. Integration of heat pipes may be accomplished by drilling holes in the heat sink, inserting the pipe, and sealing ends. Alternatively, holes may be drilled, wick tubes inserted, heat pipe fluid sealed and the hole sealed.

FIG. 2E shows yet another embodiment of the invention using a heat sink which includes an integrated slide mechanism 251 which performs that additional function of producing a retaining force on chips 255, 256, and 206. The slide member moves along arrows 253 within an opening 254 within main body of the heat sink 201. Thermal grease can be used to enhance thermal conductivity between the sliding surfaces. Chip 206 is shown with a contact surface 252 of sliding member 251. A structural cover or partial cover 250 is shown here to illustrate how the whole package can be self contained. This slide feature can be used with dendrite interconnections between chip and flexible substrate and between flexible substrate and circuit board for dismountable/detachable module.

As an alternative to mounting small chips at the end of each lead, one large chip may be mounted connecting the chip to pads at the ends of two or more leads. This configuration is shown in FIG. 3, where a chip carrier 300 similar to that which is shown in FIG. 1 has a large chip 301 straddling the ends of two leads 302.

Figure 3:
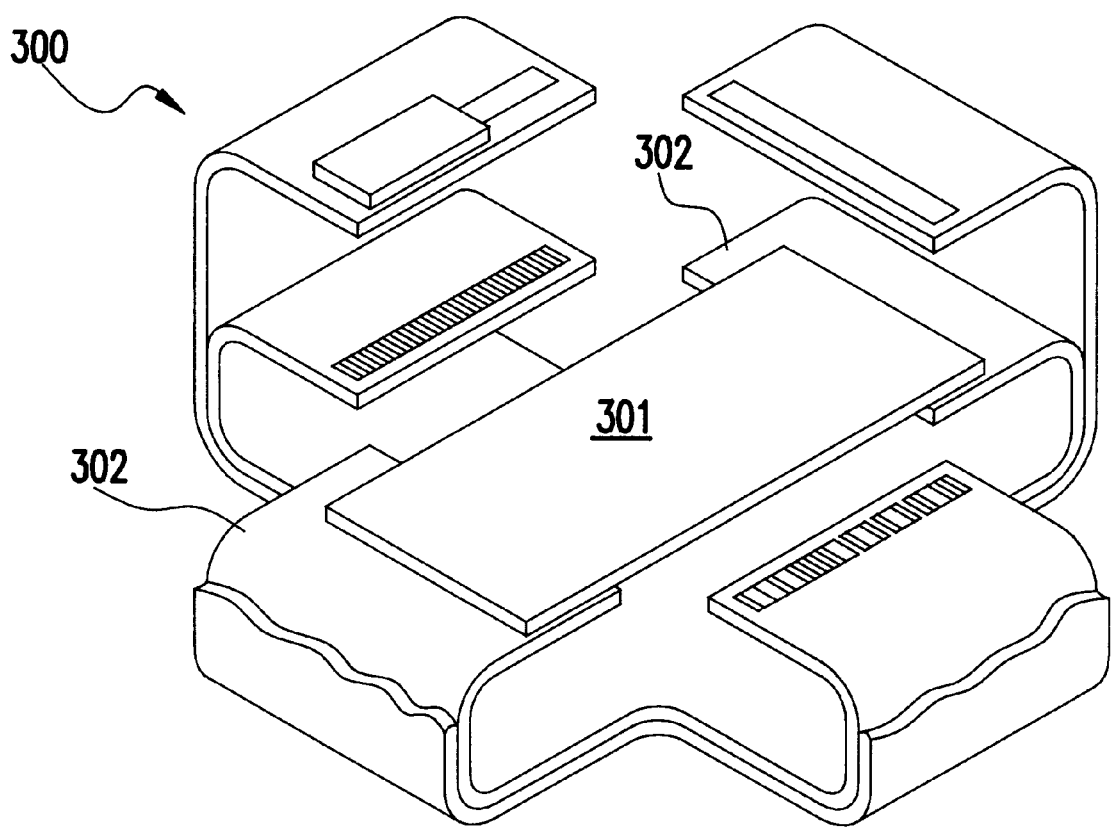
FIG. 3 is an isometric view of the inventive chip carrier with an alternative mounting of chips.
Figure 4:
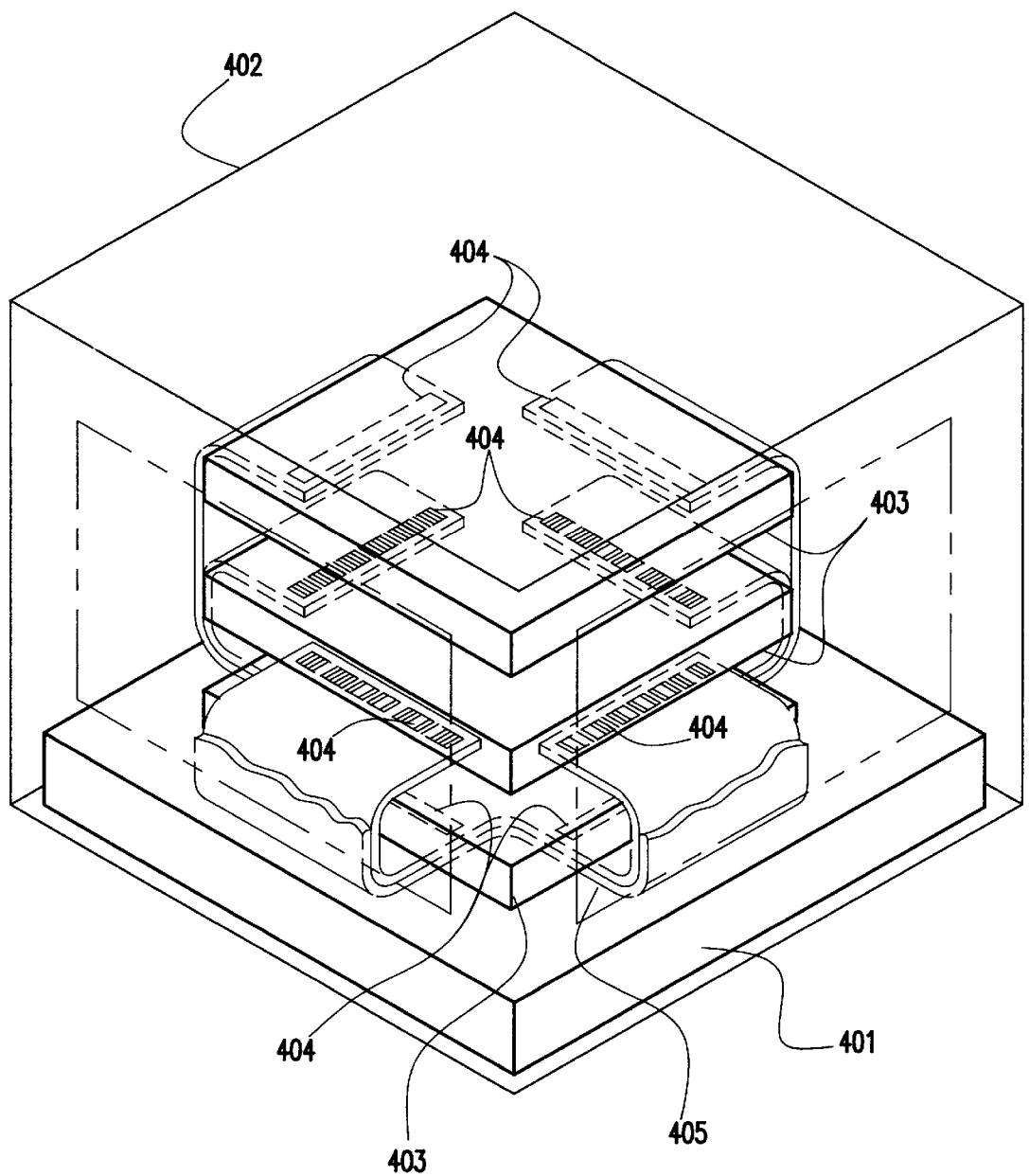
FIG. 4 is an isometric view, partially in phantom, of the inventive chip carrier surrounded by a heat sink.

In the configuration shown in FIG. 3 a heat sink may be added which has a shape allowing for the chip placement or the chip carrier may be surrounded by a heat sink as is shown in FIG. 4. In FIG. 4 the chip carrier 405 is mounted on a substrate 401 and surrounded by a heat sink 402. The heat sink 402 may act as a support member surrounding the chip carrier. Chips 403 can be mounted on the lead contacts 404 in a tiered fashion by the various means previously discussed.

Figure 5A:
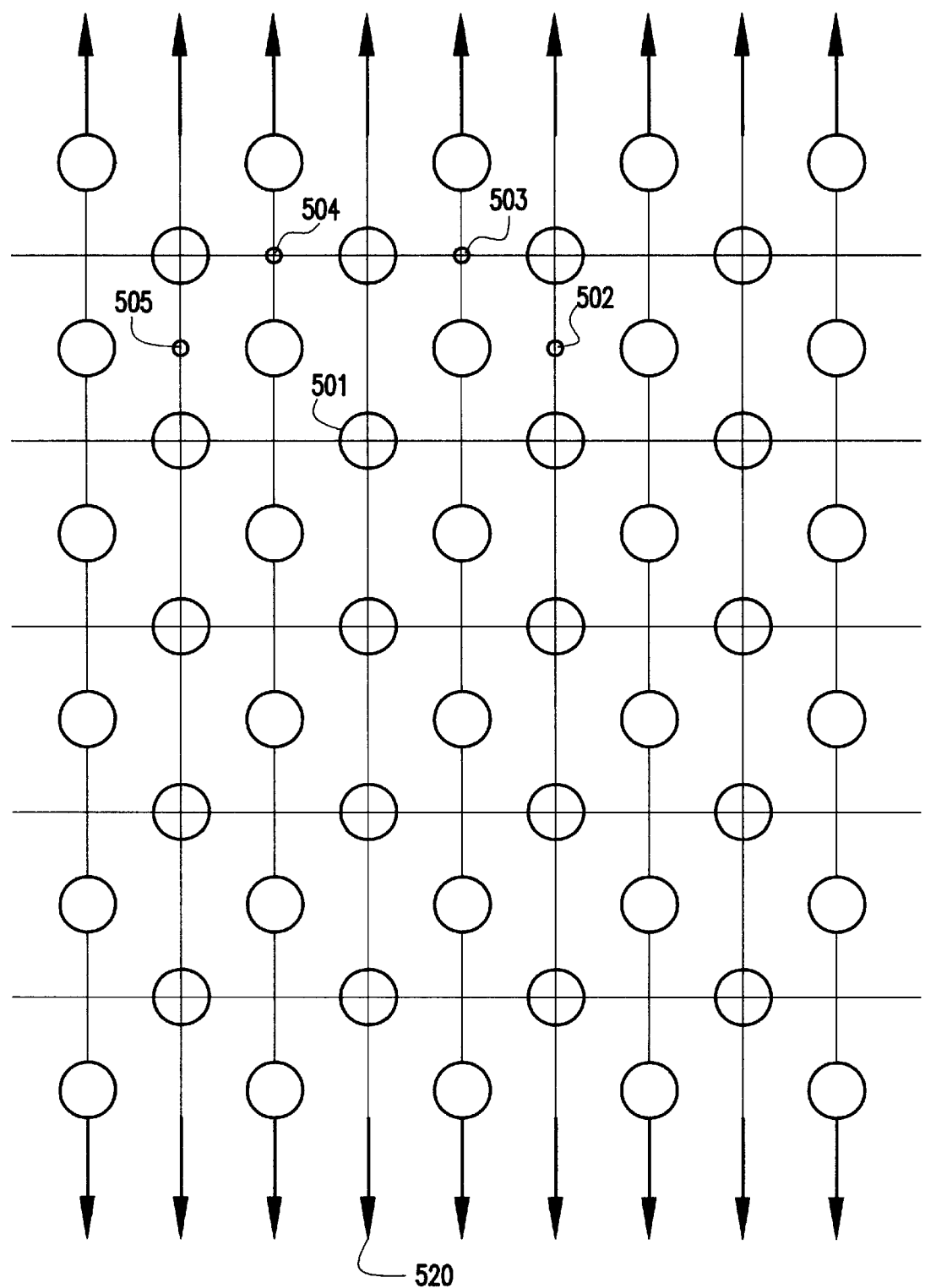
FIGS. 5A and 5B are plan views showing examples of how interconnecting plated through holes between each interstitial circuitized grid, in a two stacked package, can form various hole patterns.
Figure 5B:
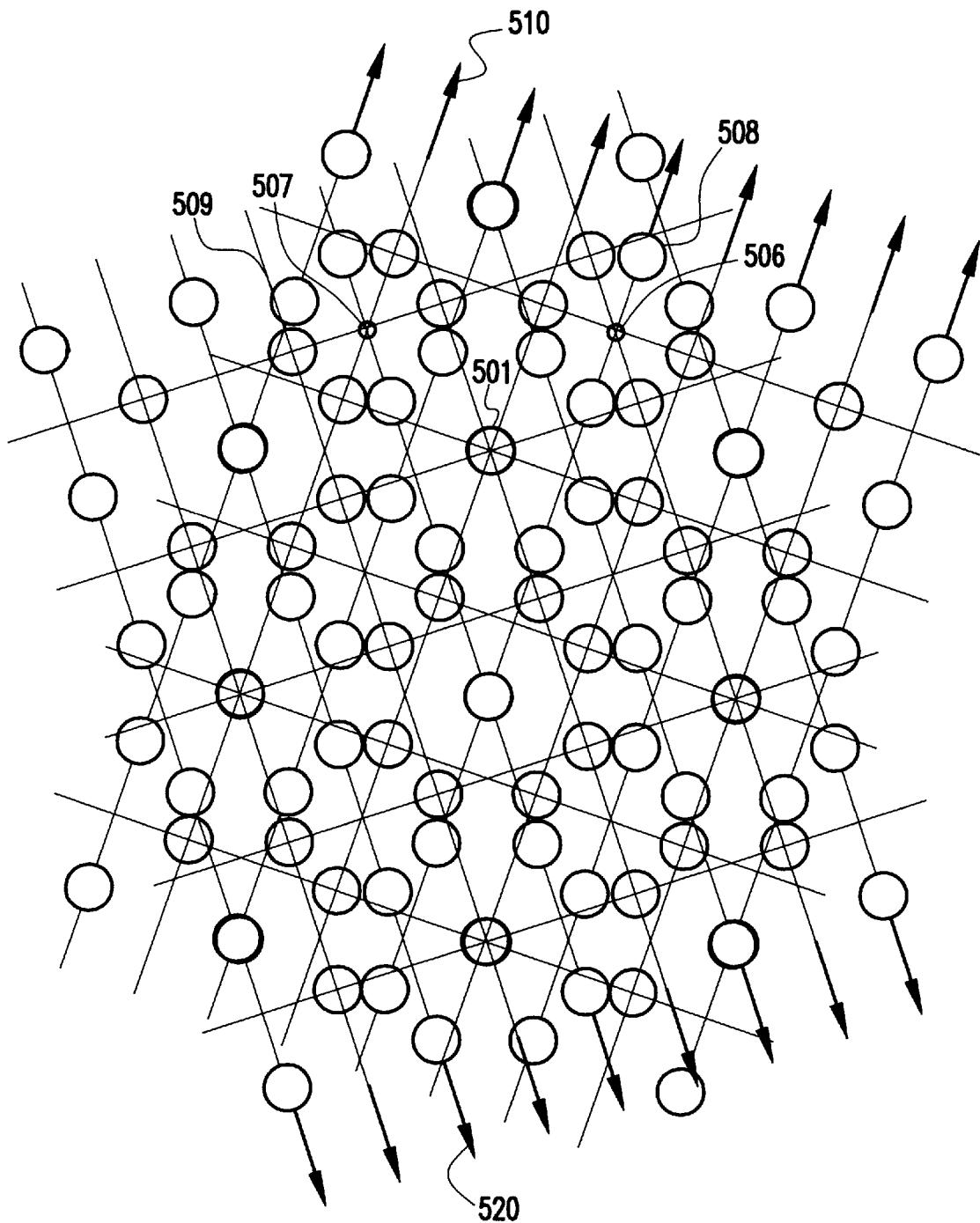

High density connection can be made within the central portion of the "stacked carriers" such as 204 and 205 shown in FIG. 2, while maintaining less dense line spaces by rotating the two carriers relative to one another. FIGS. 5A and 5B illustrate this by showing the patterns created by through holes in two "cross (+)" carriers similar to those described in FIG. 1. When the "cross (+)" carriers orientated are used with an interstitial hole or via pattern shown in FIG. 5A and are rotated 45° relative to each other, similar to the schematic in FIG. 1, a dense hole pattern distribution is formed as found in FIG. 5B. These patterns can be used in planning for shielding of signals.

For purposes of example, FIG. 5A shows the superimposed positions of hole patterns of one flex circuit carrier overlain over a second flexible circuit carrier, at the central area of the "cross (+)" configuration shown in FIG. 1. Both patterns are an interstitial pattern and, in FIG. 5A overlay each other. Arrows 510 pointing upwards represent an upper flexible circuit carrier; arrows 520 pointing downward represent the lower carrier. If carrier 510 is rotated 45° about through hole 501, points 503 from the top plane 510 align with points 502 of the bottom plane 520 as points 506; points 505 from the top plane 510 align with points 504 of the bottom plane 520 as points 507; and the intersecting hole pattern of FIG. 5B results. Returning to FIG. 5A, if a via (through hole) is formed in the upper flexible circuit carriers 510, 520 at points 502, 503, 504 and 505, intersecting thru vias are formed at 506, 507, respectively. Surrounding each through via 506 and 507 are rings of other through holes 508 and 509, respectively. By selecting through vias 506 and 507 as signal vias while designating the surrounding ring of through hole vias 508 and 509 as grounds, signal vias 506 and 507 are electrically shielded.

Figure 6:
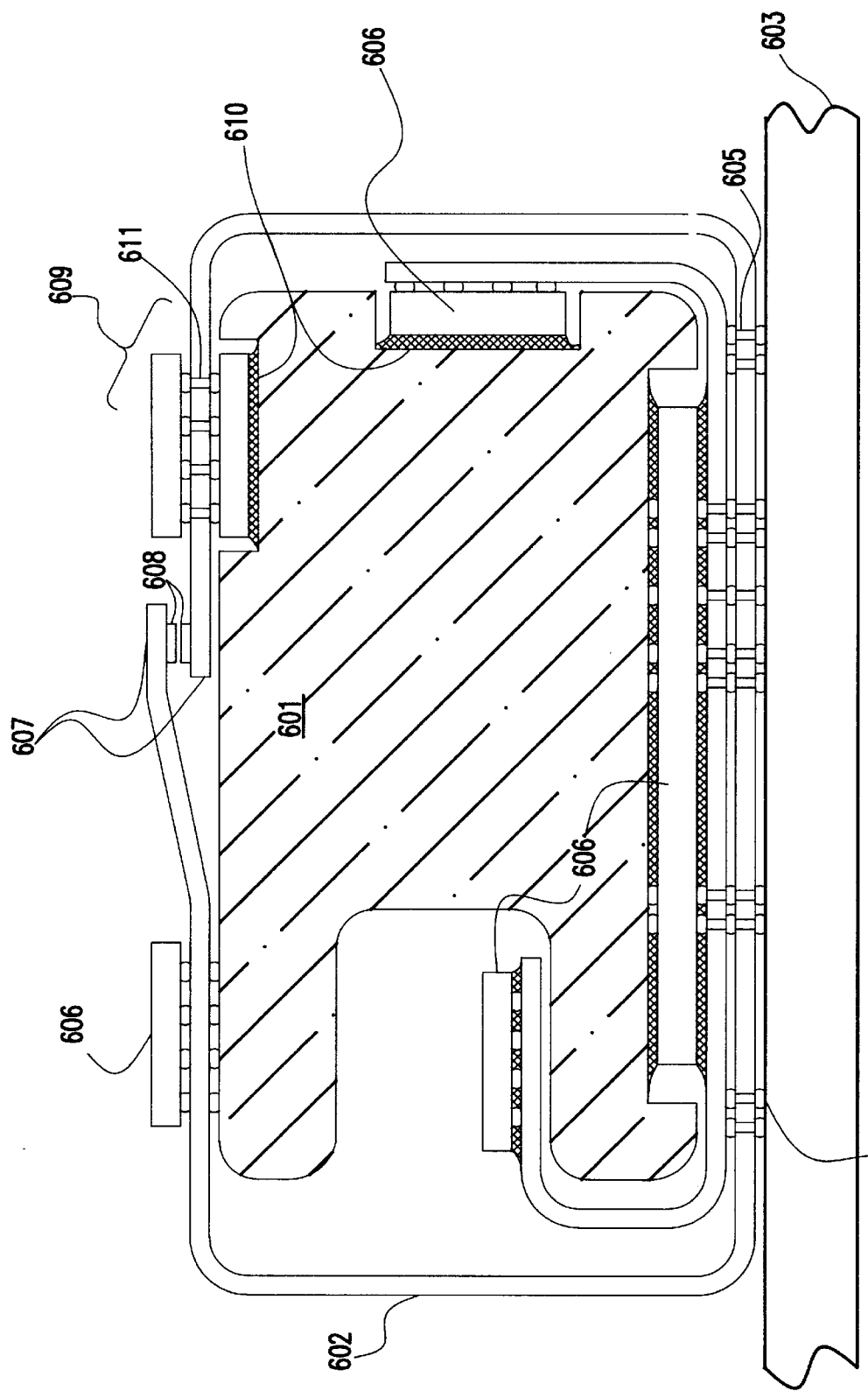
FIG. 6 is an isometric view showing another configuration of the inventive chip carrier showing examples of various chip mounting and circuit interconnect schemes.

FIG. 6 shows another configuration for the inventive chip carrier. This figure shows the heat sink 601 fitting within folded portion of flex 602. Flex 602 is connected to a board 603 by solder balls or dendrites 604. Through vias 605 may be used at this point to provide a circuit connection to the board. Chips 606 are connected to the flexible material 602 at various sites. The chips can be attached to the heat sink using a thermal adhesive 610. Ends 607 of the flexible material 602 have contact pads 608 so that a connection at the ends 607 may provide an alternative intra carrier communication path. This figure also shows connection of chips "back-to-back" on the same section 609 of flexible material. When this is done, a via communication path 611 is formed connecting the two chips.

While the invention has been described in terms of its preferred embodiments, those skilled in the art will recognize that the invention can be practiced with modification within the spirit and scope of the appended claims.

We claim:

1. A circuitized chip carrier comprising:
   one layer of a flexible material having at least one wiring layer including wiring traces, said one layer of flexible material is formed as one continuous piece in both horizontal and vertical dimensions;
   a means for each said wiring layer to communicate through said flexible material;
   a heat sink adhered to said one layer of flexible material and holding said one layer of flexible material in a three dimensional (3D) form;
   a plurality of chip connection pads for mounting chips in any direction on said one layer of flexible material, said chip connection pads connected to said wiring layer on said layer of flexible material; and
   carrier attachment pads on said one layer of flexible material for providing signals and power.

2. A circuitized chip carrier comprising:
   a flexible material having a multiplicity of sublayers, at least one of said sublayers including wiring traces, said flexible material formed as one continuous piece in both horizontal and vertical directions;
   a means for each said wiring layer to communicate through said sublayer and between each of said multiplicity of sublayers of flexible material;
   a heat sink adhered to said at least one sublayer of flexible material and holding said at least one sublayer of flexible material in a three-dimensional (3D) form;
   a plurality of chip connection pads for mounting chips in any direction on said at least one sublayer of flexible material, said chip connection pads connected to said wiring layer on said sublayer of flexible material; and
   carrier attachment pads on said one sublayer of flexible material for providing signals and power.

3. A circuitized chip carrier comprising:
   a multiplicity of layers of a flexible material having at least one wiring layer including wiring traces, where in at least one layer of flexible material is formed as one continuous piece in both horizontal and vertical dimensions, and wherein each said layer of flexible material is stacked against another layer;
   a means for each said wiring layer to communicate through said flexible material and between each of said multiplicity of layers of flexible material;
   a heat sink adhered to said at least one wiring layer and holding said wiring layer of flexible material in a three dimensional (3D) form;
   a plurality of chip connection pads for mounting chips in any direction on said wiring layer of flexible material, said chip connection pads connected to said wiring layer on said layer of flexible material; and
   carrier attachment pads on said one layer of flexible material for providing signals and power.

4. A circuitized chip carrier as in claim 1, wherein said heat sink further comprises a multiplicity of internal cooling channels.

5. A circuitized chip carrier as in claim 1, wherein said heat sink has a multiplicity of chip cavities, each of said chip cavities being matched to a multiplicity of said chip connection pads.

6. A circuitized chip carrier as in claim 1, wherein said heat sink includes a slidable member exerting pressure in a direction of said chip connection pads.

7. A circuitized chip carrier as in claim 6, further comprising thermal grease between said slidable member and said heat sink.

8. A circuitized chip carrier as in claim 1, wherein said heat sink further comprises a heat pipe.

9. A circuitized chip carrier as in claim 1 further comprising an air flow passage wherein said flexible material is folded leaving spaces for said air flow.

10. A circuitized chip carrier as in claim 1 further comprising a multiplicity of contact pads on said flexible material.

11. A circuitized chip carrier as in claim 1, wherein said chip connection pads are on an inside surface and on an outside surface of said flexible material.

12. A circuitized chip carrier as in claim 1, wherein said heat sink surrounds said layer of flexible material held in said preferred form.

13. A circuitized chip carrier as in claim 1, wherein said heat sink is surrounded by said layer of flexible material held in said preferred form.

14. A circuitized chip carrier as in claim 1, wherein said chip connection pads are comprised of dendritic attachments.

15. A circuitized chip carrier as in claim 1, wherein said heat sink further comprises at least one anchoring surface for applying an opposing mechanical force to a chip mounted on said chip connection pads.

16. A circuitized chip carrier as in claim 14, wherein said opposing mechanical force is a spring applied to said chip's backside.

17. A circuitized chip carrier as in claim 14, wherein said opposing mechanical force is a clamp clamping said chip to said at least one layer.

18. A circuitized chip carrier as in claim 14, wherein said opposing mechanical force is a clip holding said chip to said at least one layer.

19. A circuitized chip carrier as in claim 3, wherein each of said at multiplicity of layers further comprises an array of contacts, said arrays being rotated relative to each other such that signal lines between said two layers are electrically shielded.

20. A circuitized chip carrier as in claim 19, wherein one layer of said at least two layers includes a plurality of said plurality of chip connection pads at opposite ends such that when said one layer is formed into said 3D form, a chip mounting location is formed by said opposite ends.

21. A method of assembling an integrated circuit chip carrier comprising the steps of:

attaching an electronic component to a first side of a flexible circuitized carrier;

attaching a second electronic component to a second side of said flexible circuitized carrier;

forming said flexible circuitized carrier into a three-dimensional shape in one continuous piece around at least two separate surfaces of a heat sink;

attaching said formed flexible circuitized carrier to a substrate.

22. A method of assembling an integrated circuit chip carrier as in claim 21 further comprising bonding said flexible circuitized carrier to a second flexible circuitized carrier, said second flexible circuitized including at least one attached electronic component, both said flexible circuitized carrier and said second flexible circuitized carrier being formed around said heat sink.

23. A method of assembling an integrated circuit chip carrier as in claim 22 further comprising testing said electronic components after mounting said second electronic component.

24. A method of assembling an integrated circuit chip carrier as in claim 23 further comprising testing said electronic components after mounting said formed carriers to said substrate.

25. A method of assembling an integrated circuit chip carrier as in claim 22 wherein said second flexible circuit is bond ed to said first flexible circuit using carrier to carrier contact pads.

26. A method of assembling an integrated circuit chip carrier as in claim 25 wherein dendrites the first said carrier connect contact pads on said second said carrier.

27. A method of assembling an integrated circuit chip carrier as in claim 22 wherein a conductive adhesive is us ed to bond said flexible circuitiezed carriers.

28. A method of assembling an integrated circuit chip carrier as in claim 22 wherein said circuitized carriers are retained on surfaces of said heat sink.

29. A method of assembling an integrated circuit chip carrier comprising the steps of:

bonding a first flexible circuitized carrier to a second flexible circuitited carrier;

attaching an electronic component to a first side of said bonded flexible circuitized carriers;

attaching a second electronic component to a second side of said bonded flexible circuitized carriers;

forming said bonded flexible circuitized carriers around a heat sink;

attaching said formed carriers to a substrate.

30. A method of assembling an integrated circuit chip carrier as in claim 29 further comprising testing said electronic components after mounting said second electronic component.

31. A method of assembling an integrated circuit chip carrier as in claim 30 further comprising testing said electronic components after mounting said formed carriers to said substrate.

* * * * *